(12) United States Patent
Sawahara et al.

(10) Patent No.: US 12,081,201 B2
(45) Date of Patent: Sep. 3, 2024

(54) INRUSH CURRENT SUPPRESSION CIRCUIT

(71) Applicants: Kabushiki Kaisha Toshiba, Tokyo (JP); Toshiba Electronic Devices & Storage Corporation, Tokyo (JP)

(72) Inventors: Yuichi Sawahara, Kanagawa (JP); Hideaki Majima, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/119,241

(22) Filed: Mar. 8, 2023

(65) Prior Publication Data

US 2024/0106427 A1 Mar. 28, 2024

(30) Foreign Application Priority Data

Sep. 26, 2022 (JP) ................................. 2022-152171

(51) Int. Cl.
*H03K 17/081* (2006.01)
*H03K 17/0812* (2006.01)
*H03K 17/687* (2006.01)
*H03K 17/74* (2006.01)

(52) U.S. Cl.
CPC ... *H03K 17/08122* (2013.01); *H03K 17/6871* (2013.01); *H03K 17/74* (2013.01)

(58) Field of Classification Search
None
See application file for complete search history.

(56) References Cited

U.S. PATENT DOCUMENTS

| | | | |
|---|---|---|---|
| 8,630,104 B2 | 1/2014 | Ouchi et al. | |
| 8,649,198 B2* | 2/2014 | Kuzumaki | H02M 7/5387 363/17 |
| 10,715,131 B2 | 7/2020 | Bunin et al. | |
| 11,381,237 B2* | 7/2022 | Fujiwara | H03K 17/063 |
| 11,606,029 B2* | 3/2023 | Saini | H02M 3/158 |

FOREIGN PATENT DOCUMENTS

| | | |
|---|---|---|
| JP | 2012-125090 A | 6/2012 |
| JP | 6067443 B2 | 1/2017 |
| JP | 6852471 B2 | 3/2021 |

* cited by examiner

*Primary Examiner* — Jeffrey S Zweizig
(74) *Attorney, Agent, or Firm* — Kim & Stewart LLP

(57) ABSTRACT

According to one embodiment, an inrush current suppression circuit includes a normally-on transistor, a normally-off transistor connected in series with the normally-on transistor, a first drive circuit that drives the normally-on transistor, a second drive circuit that drives the normally-off transistor, a diode connected between an output of the first drive circuit and an output terminal of the normally-off transistor, a first power source smoothing circuit that performs smoothing of a source current to be supplied to the first drive circuit and the second drive circuit, and a switch circuit that switches connection/disconnection of a current path passing through the first power source smoothing circuit.

14 Claims, 9 Drawing Sheets

INRUSH CURRENT SUPPRESSION CIRCUIT

CROSS-REFERENCE TO RELATED APPLICATIONS

This application is based upon and claims the benefit of priority from Japanese Patent Application No. 2022-152171, filed on Sep. 26, 2022; the entire contents of which are incorporated herein by reference.

FIELD

Embodiments described herein relate generally to an inrush current suppression circuit.

BACKGROUND

As one of switching elements in a power converter circuit, there has been conventionally known a configuration in which a GaN N-channel MOS transistor and a P-channel LDMOS transistor are connected in series.

In the above-described configuration, after a voltage of a main circuit power source is applied, until an insulated power source serving as a power source of a gate driver, a UVLO, and the like is activated, there has been no way but to obtain standby electricity of a circuit that is necessary for maintaining an off state of the GaN N-channel MOS transistor and an off state of the P-channel LDMOS transistor, from the main circuit power source.

Accordingly, current that charges a capacitance through the GaN N-channel MOS transistor, and passes through a diode connected between a gate of the GaN N-channel MOS transistor and a drain of the P-channel LDMOS transistor is inevitably generated. Depending on a value of the current, because there has been no way but to select a diode with a large rated value, influence on circuit characteristics such as an increase in terminal capacitance has been exerted.

In view of the foregoing, it is demanded to provide an inrush current suppression circuit that can suppress an inrush current and can suppress influence on circuit characteristics.

DETAILED DESCRIPTION

Figure 1:
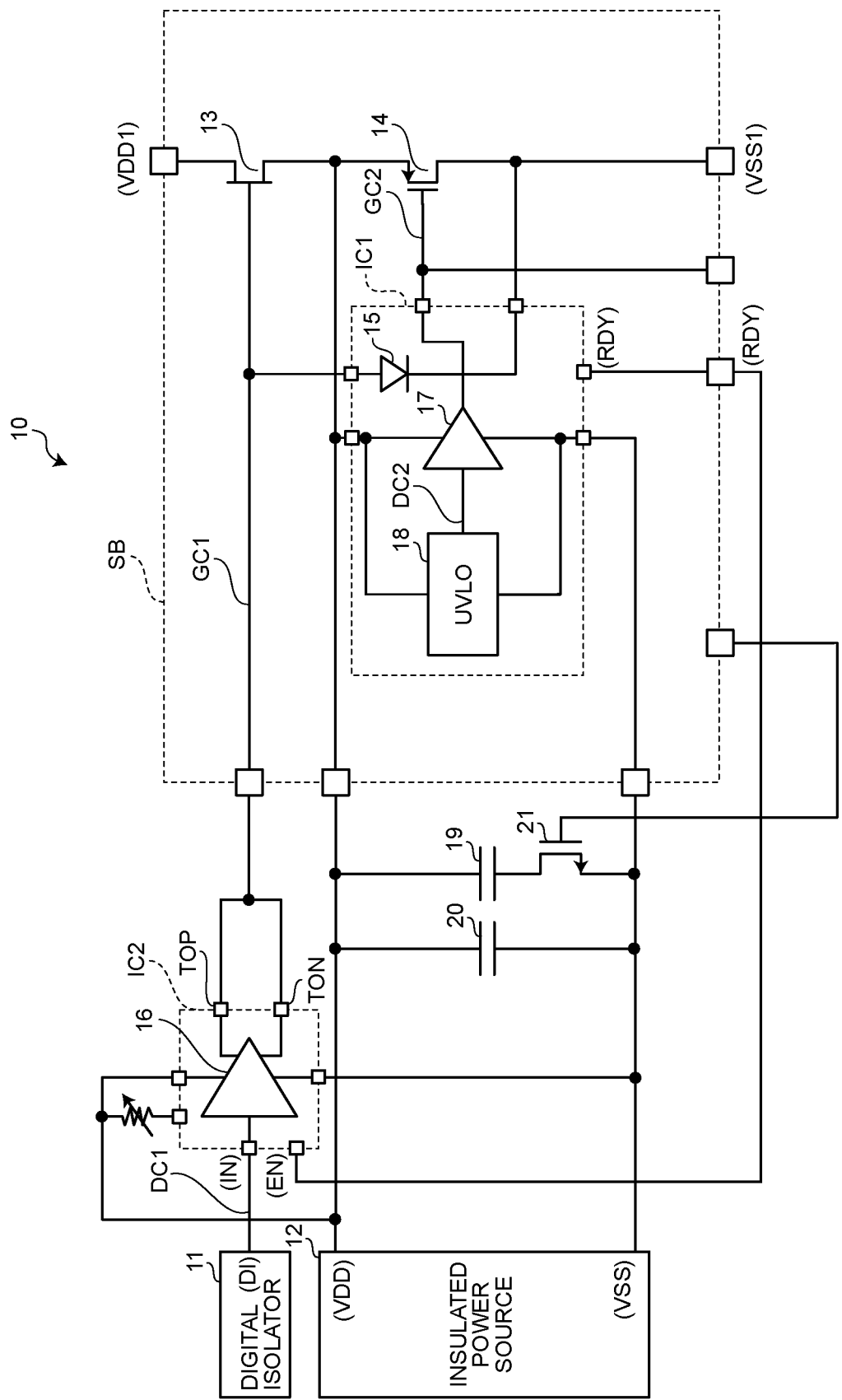
FIG. 1 is a schematic configuration explanatory diagram of a power converter circuit of a first embodiment.

In general, according to one embodiment, an inrush current suppression circuit includes a normally-on transistor, a normally-off transistor connected in series with the normally-on transistor, a first drive circuit configured to drive the normally-on transistor, a second drive circuit configured to drive the normally-off transistor, a diode connected between an output of the first drive circuit and an output terminal of the normally-off transistor, a first power source smoothing circuit configured to perform smoothing of a source current to be supplied to the first drive circuit and the second drive circuit, and a switch circuit configured to switch connection/disconnection of a current path passing through the first power source smoothing circuit.

Exemplary embodiments of an inrush current suppression circuit will be explained below in detail with reference to the accompanying drawings. The present invention is not limited to the following embodiments.

First of all, the object of an embodiment will be described. As one of switching elements in a power converter circuit, in a configuration in which a GaN N-channel MOS transistor and a P-channel LDMOS transistor are connected in series, after a voltage of a main circuit power source is applied, until an insulated power source serving as a power source of a gate driver, a UVLO, and the like is activated, there is no way but to obtain standby electricity of a circuit that is necessary for maintaining an off state of the GaN N-channel MOS transistor and an off state of the P-channel LDMOS transistor, from the main circuit power source.

Accordingly, current that charges capacitance through the GaN N-channel MOS transistor, and passes through a diode connected between a gate of the GaN N-channel MOS transistor and a drain of the P-channel LDMOS transistor is inevitably generated. Depending on a value of the current, because there has been no way but to select a diode with a large rated value, influence on circuit characteristics such as an increase in terminal capacitance has been exerted.

In view of the foregoing, in the technique described in the specification of U.S. Pat. No. 10,715,131, switching has been prevented from being affected, by providing a transistor switch at a node between a GaN N-channel MOS transistor and a P-channel LDMOS transistor that is wired to an insulated power source, and when a main circuit power source is activated, bringing the transistor switch into an off state, and blocking a current path, and after the insulated power source is activated, bringing the transistor switch into an on state.

Nevertheless, if the transistor switch is brought into the off state when the main circuit power source is activated, the current path is completely blocked.

Thus, standby electricity of a circuit that is necessary for maintaining the off state of the GaN N-channel MOS transistor and the off state of the P-channel LDMOS transistor cannot be obtained, and the GaN N-channel MOS transistor and the P-channel LDMOS transistor can enter the on state.

Accordingly, a configuration of preventing the P-channel LDMOS transistor from entering the on state by loading a resistor between a gate and a source of the P-channel LDMOS transistor has been employed. Nevertheless, depending on the resistance value of the resistor, there has been concern that influence on circuit characteristics cannot be suppressed, or the P-channel LDMOS transistor cannot be prevented from entering the on state.

In view of the foregoing, the present embodiment aims to provide an inrush current suppression circuit that can suppress an inrush current, and can suppress influence on circuit characteristics. Specific description will be given below.

First Embodiment

FIG. 1 is a schematic configuration explanatory diagram of a power converter circuit of the first embodiment.

As illustrated in FIG. 1, a power converter circuit 10 of the first embodiment includes a digital isolator 11, an insulated power source 12, a GaN transistor 13, a P-channel LDMOS transistor 14, a diode 15, a first gate driver 16, a second gate driver 17, an Under Voltage Lock Out (UVLO) circuit 18, a first capacitor 19, a second capacitor 20, and a switching transistor 21.

The digital isolator 11 outputs a digital signal to an input terminal of the first gate driver 16 in an insulated state. The GaN transistor 13 is a normally-on transistor. The GaN transistor 13 is connected to a high potential side power source VDD1 of a direct-current power source at a drain terminal, connected to a high potential side power source VDD of the insulated power source 12 at a source terminal, and connected to an output terminal of the first gate driver 16 at a gate terminal.

The P-channel LDMOS transistor 14 is a normally-off transistor. The P-channel LDMOS transistor 14 is connected to a GaN N-channel MOS transistor at a source terminal, connected to a low potential side power source VSS1 of the direct-current power source at a drain terminal, and connected to an output terminal of the second gate driver 17 at a gate terminal.

The diode 15 is connected to a gate terminal of the GaN N-channel MOS transistor at an anode terminal, and connected to a drain terminal of the P-channel LDMOS transistor 14 at a cathode terminal.

The first gate driver 16 is connected to an output terminal of the digital isolator 11 at an input terminal, connected to the high potential side power source VDD of the insulated power source 12 at a high potential side power source terminal, and connected to a low potential side power source VSS of the insulated power source 12 at a low potential side power source terminal.

Furthermore, the first gate driver 16 has a positive side output terminal TOP and a negative side output terminal TON. Then, the positive side output terminal TOP and the negative side output terminal TON are connected in common to the gate terminal of the GaN transistor 13.

The second gate driver 17 is connected to the gate terminal of the P-channel LDMOS transistor 14 at an output terminal, connected to the high potential side power source VDD of the insulated power source 12 at a high potential side power source terminal, and connected to the low potential side power source VSS of the insulated power source 12 at a low potential side power source terminal. The UVLO circuit 18 includes a low-voltage malfunction prevention function. Then, the UVLO circuit 18 controls the second gate driver 17 based on the voltage of the insulated power source 12 (the high potential side power source VDD, the low potential side power source VSS).

The first capacitor 19 is connected to the high potential side power source VDD of the insulated power source 12 at one end. The second capacitor 20 is connected to the high potential side power source VDD of the insulated power source 12 at one end, and connected to the low potential side power source VSS of the insulated power source 12 at another end. A capacitance of the second capacitor 20 is set to a capacitance smaller than a capacitance of the first capacitor 19.

The switching transistor 21 is connected to another end of the first capacitor 19 at a drain terminal, connected to the low potential side power source VSS of the insulated power source 12 at a source terminal, and connected to the power converter circuit 10 at a gate terminal.

In the above-described configuration, the first gate driver 16 functions as a first drive circuit. The first gate driver 16 is formed as an IC chip IC2.

In addition, the second gate driver 17 and the UVLO circuit 18 function as a second drive circuit. In this case, the second gate driver 17 and the UVLO circuit 18 are formed integrally with the diode 15 as the IC chip IC2. In addition, the first capacitor 19 functions as a first power source smoothing circuit.

In addition, the second capacitor 20 functions as a second power source smoothing circuit. Furthermore, the GaN transistor 13, the P-channel LDMOS transistor 14, and the IC chip (including the diode 15, the second gate driver 17, and the UVLO circuit 18) are mounted on a substrate SB.

Figure 2:
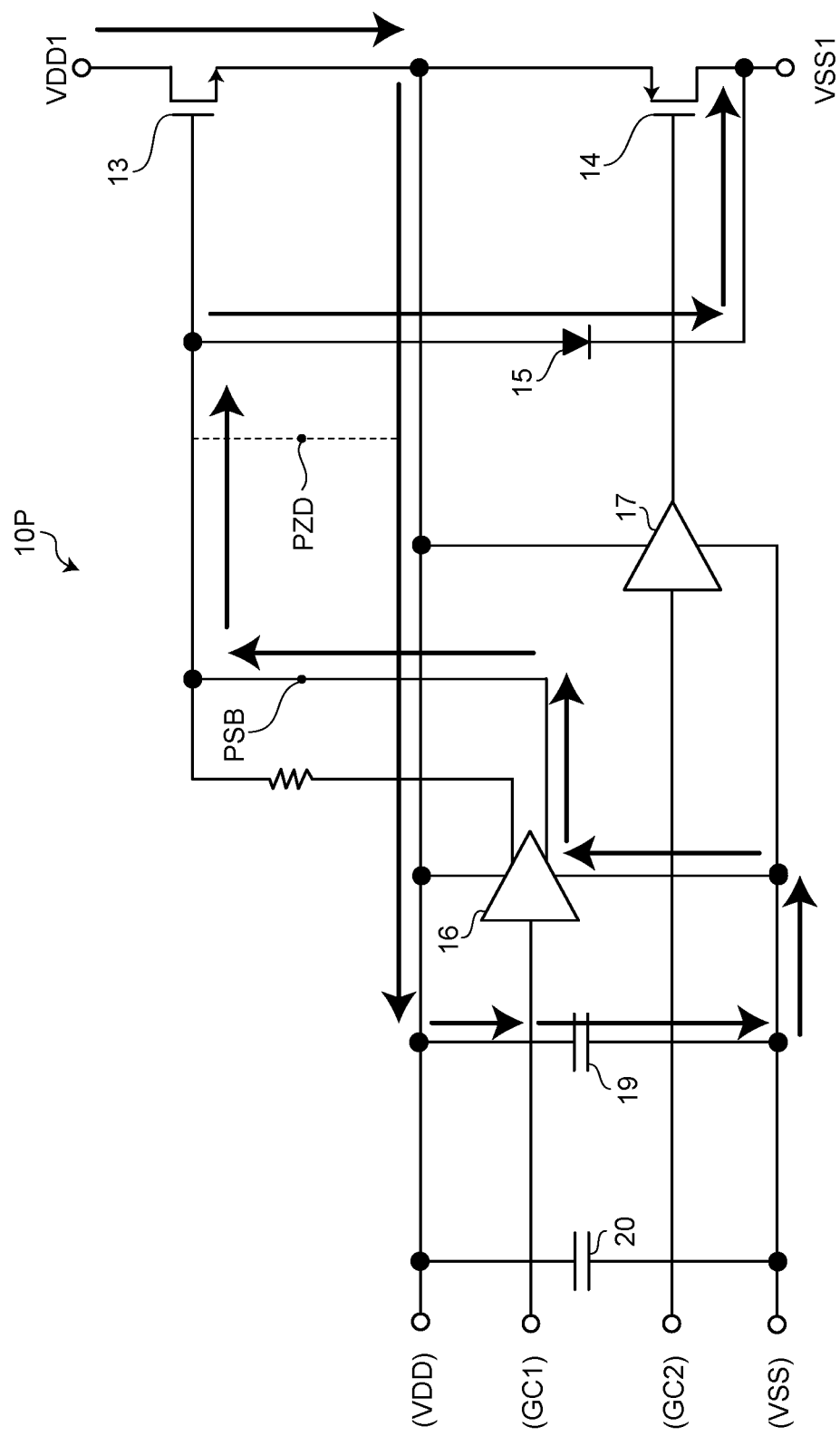
FIG. 2 is an explanatory diagram of an example of a conventional circuit configuration.

Here, prior to the operation description of the embodiment, a conventional problematic point will be described. FIG. 2 is an explanatory diagram of an example of a conventional circuit configuration. In a case where a main circuit power source is turned on in the conventional circuit configuration, an insulated power source 12 cannot start up immediately. Accordingly, in the conventional circuit configuration, until the insulated power source 12 is activated, the first gate driver 16, the second gate driver 17, the UVLO circuit 18, and the like that are operated by the insulated power source 12 are brought into a disabled state because power is not supplied.

Thus, there has been no way but to obtain standby electricity for maintaining the off state of the GaN transistor 13 and the P-channel LDMOS transistor 14, from the main circuit power source (the high potential side power source VDD1, the low potential side power source VSS1).

More specifically, a current corresponding to standby electricity flows through a path of the high potential side power source VDD1→the drain terminal of the GaN transistor 13→the source terminal of the GaN transistor 13→the first capacitor 19→a low potential side output terminal OUTN of the first gate driver 16→the anode terminal of the diode 15→the cathode terminal of the diode 15→the low potential side power source VSS1.

With this configuration, an instantaneous value peak current (inrush current) that passes through the GaN transistor 13, charges the first capacitor 19, and flows in the diode 15 is generated. Accordingly, depending on the current value of the instantaneous value peak current, there has been no way but to select the diode 15 with a large rated value, as the diode 15. With this configuration, a terminal capacitance increases, and there has been concern that circuit characteristics are affected.

To avoid this, in the prior art, a configuration of providing a transistor switch at a node between a GaN N-channel MOS transistor and a P-channel LDMOS transistor that is wired to an insulated power source, and when a main circuit power source is activated, bringing the transistor switch into an off state, and blocking a current path has been employed. Furthermore, a configuration of preventing the P-channel LDMOS transistor from entering the on state by loading a resistor between a gate and a source of the P-channel LDMOS transistor has been employed.

Thus, depending on the resistance value of the resistor, the P-channel LDMOS transistor has been enabled to be prevented from entering the on state. Nevertheless, there has been concern that the P-channel LDMOS transistor cannot be prevented from entering the on state, such as influence on circuit characteristics.

Figure 3:
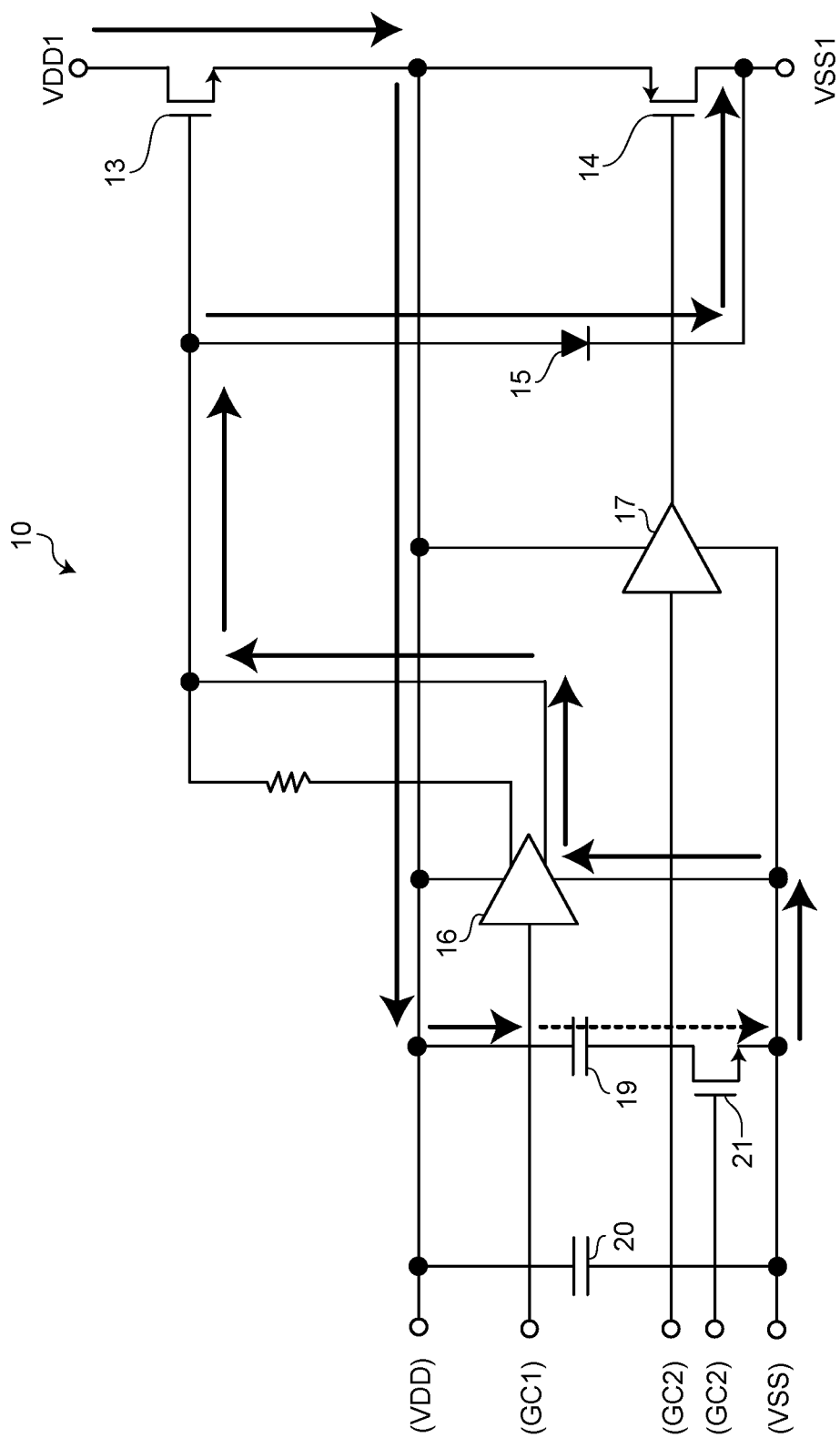
FIG. 3 is an operation explanatory diagram of the first embodiment.

Next, a schematic operation of the first embodiment will be described. FIG. 3 is an operation explanatory diagram of the first embodiment. In the first embodiment, before the main circuit power source is turned on, the gate terminal of the switching transistor 21 is set to an "L" level and brought into the off state.

Accordingly, a path of the high potential side power source VDD1 of the main circuit power source→the drain terminal of the GaN transistor 13→the source terminal of the GaN transistor 13→the first capacitor 19→the low potential side output terminal OUTN of the first gate driver 16→the anode terminal of the diode 15→the cathode terminal of the diode 15→the low potential side power source VSS1 of the main circuit power source is not formed. Concurrently with a turn-on operation of the main circuit power source, the insulated power source 12 is activated. With this configuration, at a time point at which a time sufficient for the completion of activation of the insulated power source 12 elapses, via the first gate driver 16 and the second gate driver 17, the gate terminal of the GaN transistor 13 is set to the "L" level and the GaN transistor 13 is brought into the off state, and the gate terminal of the P-channel LDMOS transistor 14 is set to the "L" level and brought into the on state.

In this case, a current path passing through the second capacitor 20 with an extremely small capacitance as compared with a capacitance of the first capacitor 19, or a current path passing through a capacitance between VDD-VSS of the UVLO circuit 18 or the like is formed. Accordingly, because a current path with an extremely small capacitance as compared with a capacitance of the first capacitor 19 is formed, it becomes possible to protect the diode 15 without large current flowing, and a stable operation can be performed.

In contrast to this, in the technique described in the specification of U.S. Pat. No. 10,715,131, because the current path is blocked in such a manner that the current path becomes completely nonexistent, an operation becomes unstable.

Figure 4:
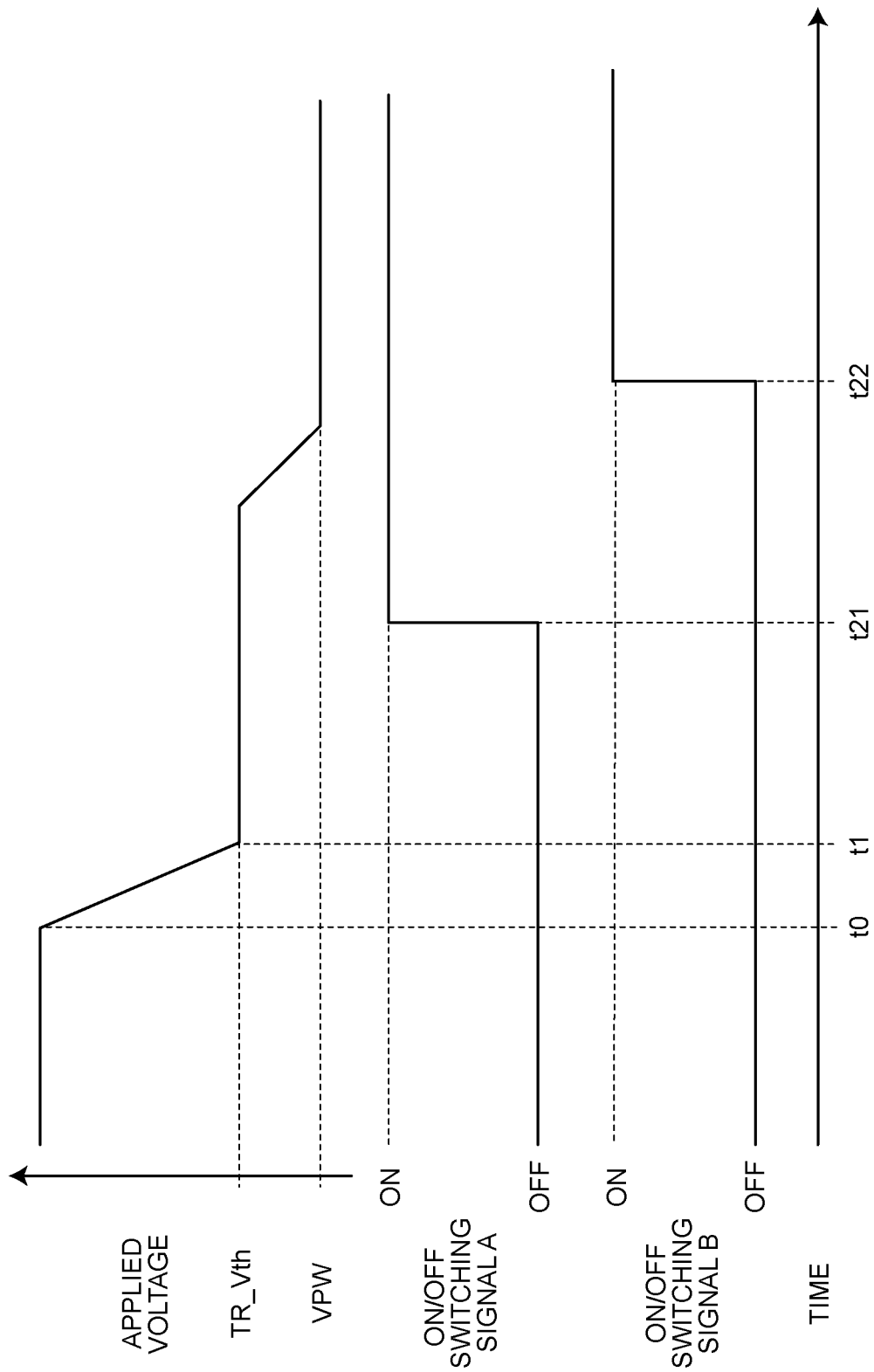
FIG. 4 is an explanatory diagram of a ON/OFF timing of a switch circuit.

FIG. 4 is an explanatory diagram of a ON/OFF timing of a switch circuit. Meanwhile, as a signal to a switch circuit (the switching transistor 21), after an inrush current is prevented, an on signal needs to be input. If the main circuit power source (the high potential side power source VDD1, the low potential side power source VSS1) is turned on at a time to, a voltage that uses a voltage of the main circuit power source is generated in a driver such as the first gate driver 16 and the second gate driver 17. Then, an inrush current flows during a voltage transition period (time t0 to time t1) of the main circuit power source.

After the lapse of the voltage transition period (time t0 to time t1), a switch circuit (the switching transistor 21) can be turned on.

More specifically, a switch circuit (the switching transistor 21) can be turned on during whichever period of a period in which the voltage of the main circuit power source is a voltage substantially equal to a threshold voltage TR_Vth of a GaN transistor being a normally-on transistor (specifically, for example, time t21 corresponding to ON/OFF switching signal A), or a period in which the voltage is a voltage VPW of an insulated power source being a source voltage of the first gate driver 16 and the second gate driver 17 (specifically, for example, time t22 corresponding to ON/OFF switching signal B).

Note that, until a switching signal is applied to the first gate driver 16 and a switching operation is performed, an on signal needs to be applied to the switch circuit (the switching transistor 21) in such a manner that a capacitance is wired with a low impedance.

In this case, by continuously applying a direct current potential at an "H" level or the "L" level to the second gate driver 17 from the UVLO circuit 18, the P-channel LDMOS transistor 14 is brought into the on state, and by turning on/off the GaN transistor 13 by applying a switching signal to the first gate driver 16, the power converter circuit is operated.

Subsequently, the gate terminal of the switching transistor 21 is set to the "H" level. Consequently, the main circuit power source can be turned on without generating an inrush current flowing in the diode 15. With this configuration, it is possible to use the diode 15 with a rated value that can flow sufficient current during a normal operation, as the diode 15, and suppress an increase in terminal capacitance, so that circuit characteristics are not affected.

First Modified Example of First Embodiment

Figure 5:
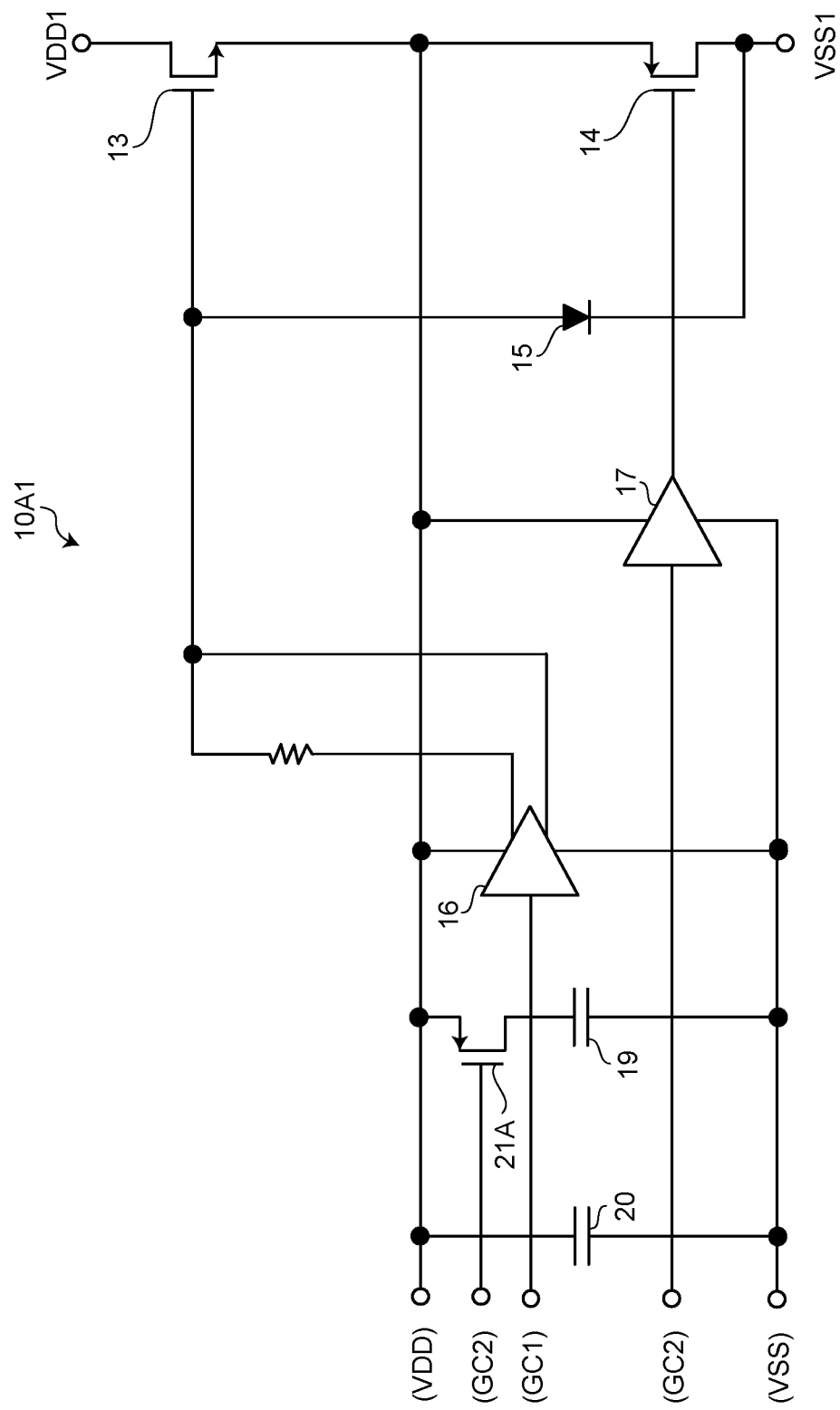
FIG. 5 is an explanatory diagram of a first modified example of the first embodiment.

FIG. 5 is an explanatory diagram of a first modified example of the first embodiment. In the above-described first embodiment, the switching transistor 21 is connected to the first capacitor 19 and the low potential side power source VSS of the insulated power source 12, but in a modified example of the first embodiment, as illustrated in FIG. 5, a switching transistor 21A is connected to a first capacitor 19 and a high potential side power source VDD of an insulated power source 12.

Consequently, similarly to the first embodiment, when the main circuit power source is turned on, a path of the high potential side power source VDD1→ the drain terminal of the GaN transistor 13→the source terminal of the GaN transistor 13→the first capacitor 19→the low potential side output terminal OUTN of the first gate driver 16→the anode terminal of the diode 15→the cathode terminal of the diode 15→the low potential side power source VSS1 is not formed. Thus, at a time point at which a time sufficient for the completion of activation of the insulated power source 12 elapses, via the first gate driver 16 and the second gate driver 17, the gate terminal of the GaN transistor 13 is set to the "L" level, and the gate terminal of the P-channel LDMOS transistor 14 is set to the "L" level and brought into the on state.

Subsequently, the gate terminal of the switching transistor 21A is set to the "L" level. Consequently, the main circuit power source can be turned on without generating an inrush current flowing in the diode 15. With this configuration, it is possible to use the diode 15 with a rated value that can flow sufficient current during a normal operation, as the diode 15, and suppress an increase in terminal capacitance, so that circuit characteristics are not affected.

Second Modified Example of First Embodiment

Figure 6:
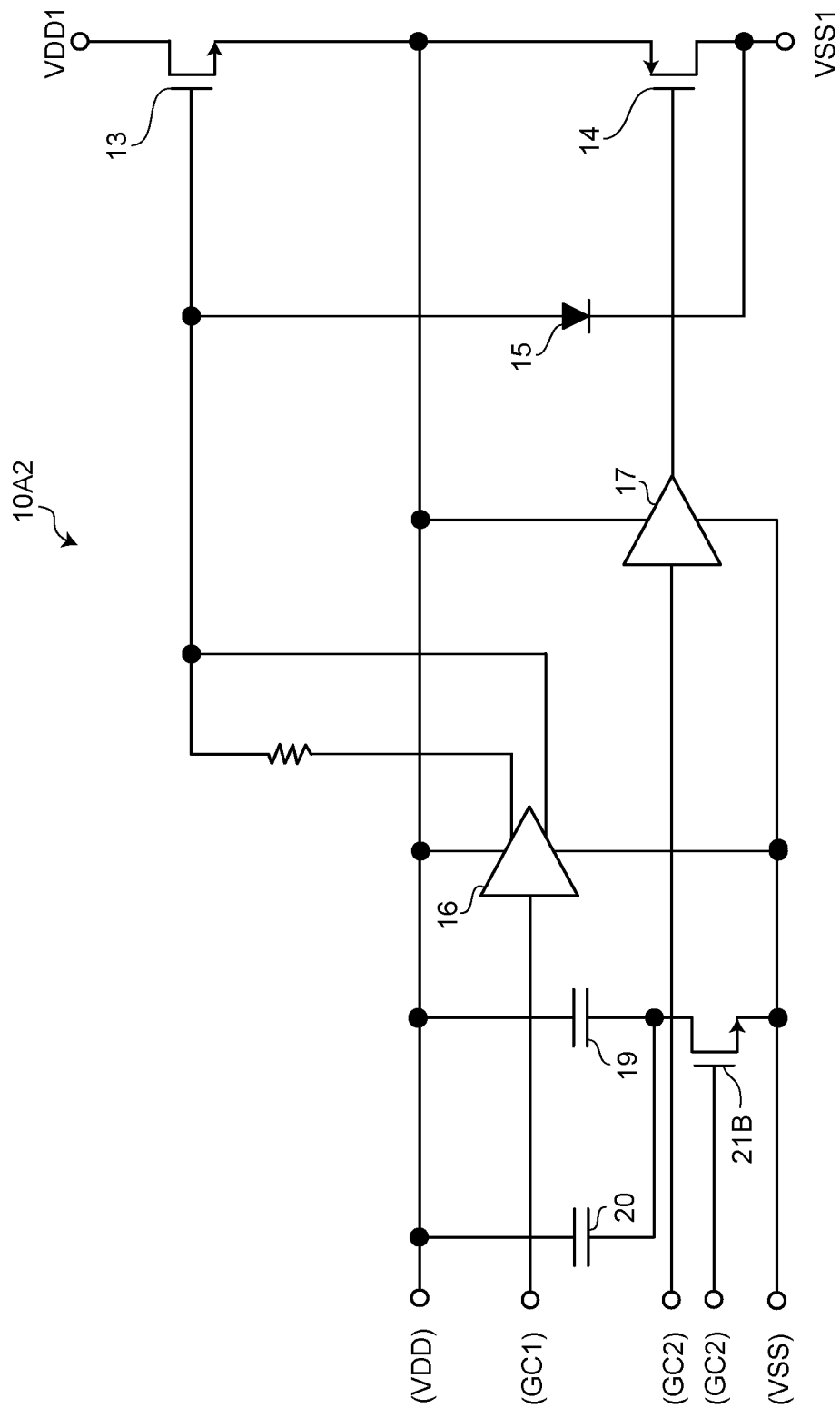
FIG. 6 is an explanatory diagram of a second modified example of the first embodiment.

FIG. 6 is an explanatory diagram of a second modified example of the first embodiment. In the first embodiment and the first modified example of the first embodiment described above, the switching transistor 21 is provided at one terminal of the first capacitor 19. In contrast to this, in the second modified example of the first embodiment, one terminals of a first capacitor 19 and a second capacitor 20 are connected in common, and a switching transistor 21B is provided between the connection point and a low potential side power source VSS of an insulated power source 12.

According to the second modified example of the first embodiment, in addition to a first current flow path of the high potential side power source VDD1→ the drain terminal of the GaN transistor 13→the source terminal of the GaN transistor 13→the first capacitor 19→the low potential side output terminal OUTN of the first gate driver 16→the anode terminal of the diode 15→the cathode terminal of the diode 15→the low potential side power source VSS1, a second current flow path of the high potential side power source VDD1→ the drain terminal of the GaN transistor 13→the source terminal of the GaN transistor 13→the second capacitor 20→the low potential side output terminal OUTN of the first gate driver 16→the anode terminal of the diode 15→the cathode terminal of the diode 15→the low potential side power source VSS1 is also blocked by the switching transistor 21. Accordingly, it is possible to further suppress an inrush current flowing through a second path, without generating an inrush current flowing in the diode 15.

Third Modified Example of First Embodiment

The above description has been given assuming that the gate terminal of the switching transistor 21 is connected to the power converter circuit 10. In this case, more specifically, it is sufficient that the gate terminal of the switching transistor 21 is connected to a controller (not illustrated) mounted on an IC chip IC1 or the IC chip IC2, and control is performed by inputting a control signal to the gate terminal of the switching transistor 21. Alternatively, it is sufficient that another control IC is provided, the gate terminal of the switching transistor 21 is connected to a controller of the control IC, and control is performed by inputting a control signal.

Second Embodiment

Figure 7:
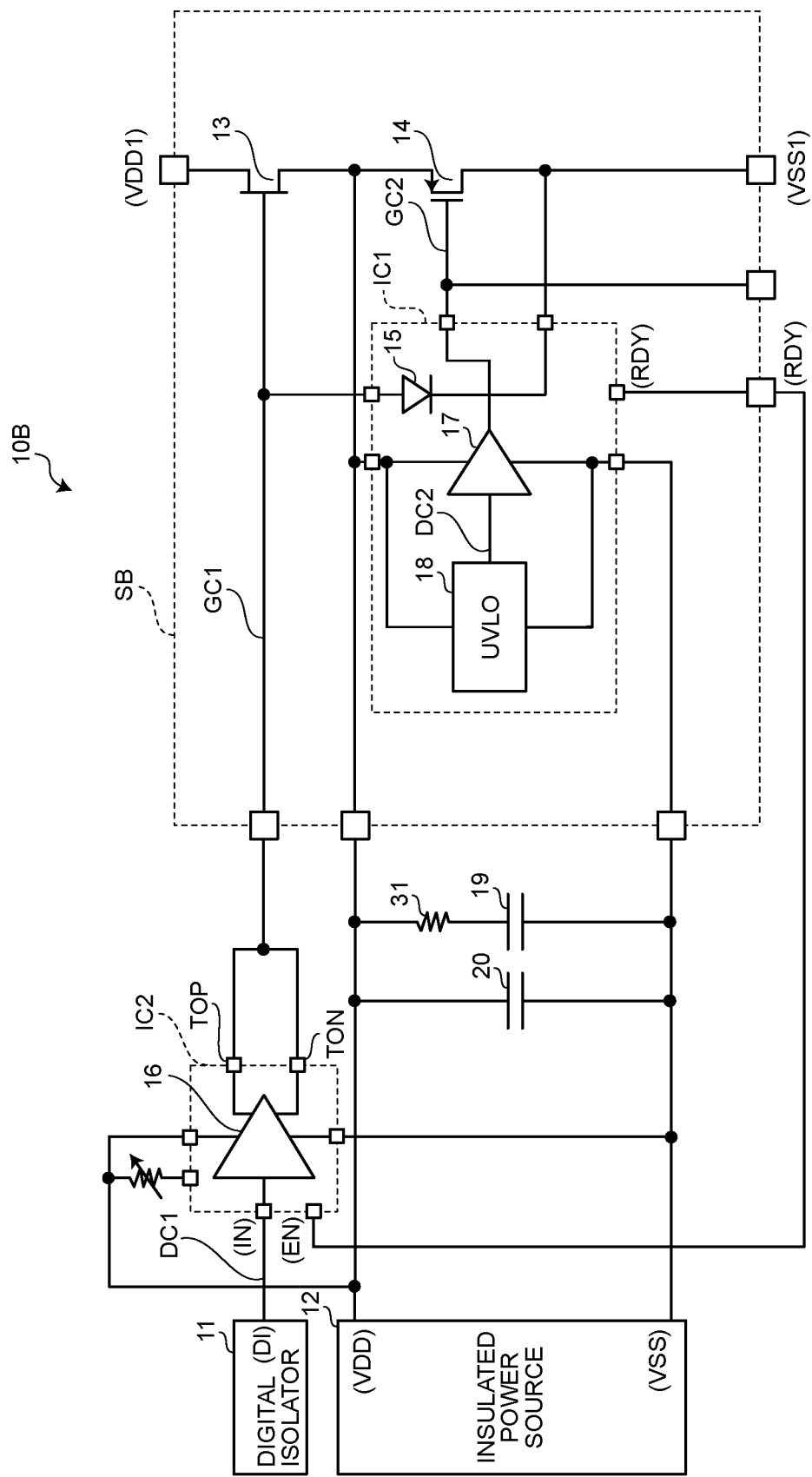
FIG. 7 is a schematic configuration diagram of a power converter circuit of a second embodiment.

FIG. 7 is a schematic configuration diagram of a power converter circuit of the second embodiment. In FIG. 7, parts similar to those of the first embodiment in FIG. 1 are assigned the same reference numerals.

As illustrated in FIG. 7, a power converter circuit 10B of the second embodiment includes a digital isolator 11, an insulated power source 12, a GaN transistor 13, a P-channel LDMOS transistor 14, a diode 15, a first gate driver 16, a second gate driver 17, an Under Voltage Lock Out (UVLO) circuit 18, a first capacitor 19, a second capacitor 20, and a resistor 31.

The digital isolator 11 outputs a digital signal to an input terminal of the first gate driver 16 in an insulated state. The GaN transistor 13 is a normally-on transistor. The GaN transistor 13 is connected to a high potential side power source VDD1 of a direct-current power source at a drain terminal, connected to a high potential side power source VDD of the insulated power source 12 at a source terminal, and connected to an output terminal of the first gate driver 16 at a gate terminal.

The P-channel LDMOS transistor 14 is a normally-off transistor. The P-channel LDMOS transistor 14 is connected to a GaN N-channel MOS transistor at a source terminal, connected to a low potential side power source VSS1 of the direct-current power source at a drain terminal, and connected to an output terminal of the second gate driver 17 at a gate terminal.

The diode 15 is connected to a gate terminal of the GaN N-channel MOS transistor at an anode terminal, and connected to a drain terminal of the P-channel LDMOS transistor 14 at a cathode terminal.

The first gate driver 16 is connected to an output terminal of the digital isolator 11 at an input terminal, connected to the high potential side power source VDD of the insulated power source 12 at a high potential side power source terminal, and connected to a low potential side power source VSS of the insulated power source 12 at a low potential side power source terminal.

Furthermore, the first gate driver 16 has a positive side output terminal TOP and a negative side output terminal TON. Then, the positive side output terminal TOP and the negative side output terminal TON are connected in common to the gate terminal of the GaN transistor 13.

The second gate driver 17 is connected to the gate terminal of a the P-channel LDMOS transistor 14 at an output terminal, connected to the high potential side power source VDD of the insulated power source 12 at a high potential side power source terminal, and connected to the low potential side power source VSS of the insulated power source 12 at a low potential side power source terminal. The UVLO circuit 18 includes a low-voltage malfunction prevention function. Then, the UVLO circuit 18 controls the second gate driver 17 based on the voltage of the insulated power source 12 (the high potential side power source VDD, the low potential side power source VSS).

The first capacitor 19 is connected to the high potential side power source VDD of the insulated power source 12 at one end. The second capacitor 20 is connected to the high potential side power source VDD of the insulated power source 12 at one end, and connected to the low potential side power source VSS of the insulated power source 12 at another end. A capacitance of the second capacitor 20 is set to a capacitance smaller than a capacitance of the first capacitor 19.

The resistor 31 is connected to another end of the first capacitor 19 at one end, and connected to the high potential side power source VDD of the insulated power source 12 at another end. In this case, as a resistance value of the resistor 31, a value as low as possible that can suppress an inrush current is set.

Figure 8:
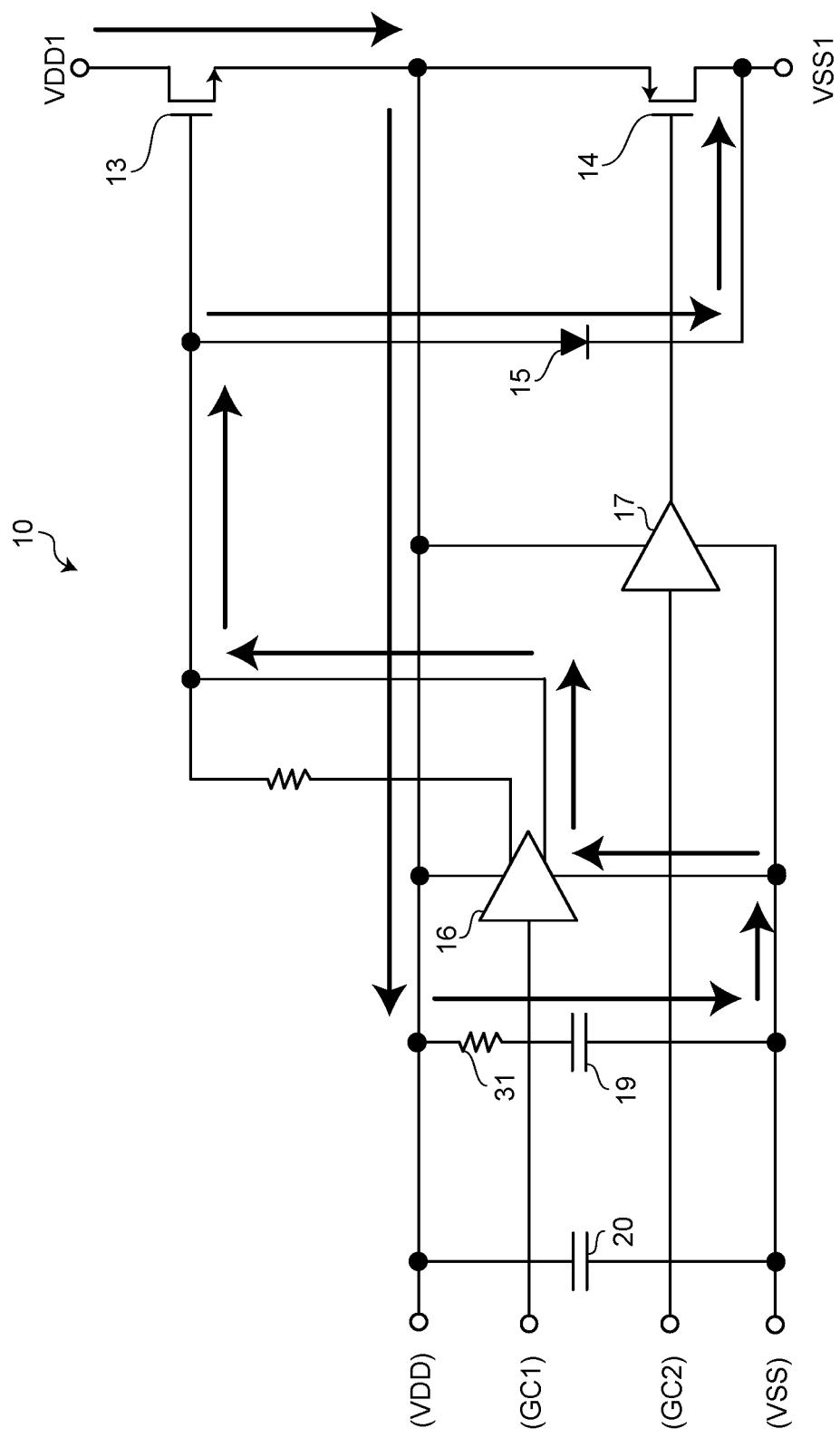
FIG. 8 is a main part configuration explanatory diagram of the power converter circuit of the second embodiment.

FIG. 8 is a main part configuration explanatory diagram of the power converter circuit of the second embodiment. With this configuration, when the main circuit power source is turned on, when a current flows through a current flow path of the high potential side power source VDD1→ the drain terminal of the GaN transistor 13→the source terminal of the GaN transistor 13→the resistor 31→the first capacitor 19→the low potential side output terminal OUTN of the first gate driver 16→the anode terminal of the diode 15→the cathode terminal of the diode 15→the low potential side power source VSS1 as indicated by arrows in FIG. 8, a current flowing through the current flow path (i.e., inrush current) can be suppressed.

Consequently, also in the second embodiment, influence on circuit characteristics can be suppressed by suppressing an inrush current.

First Modified Example of Second Embodiment

In the above-described second embodiment, a configuration in which the resistor 31 is connected between the first capacitor 19 and the high potential side power source VDD of the insulated power source 12 has been employed. In contrast to this configuration, the resistor 31 can be connected between the first capacitor 19 and the low potential side power source VSS of the insulated power source 12.

With this configuration, when the main circuit power source is turned on, when a current flows through a current flow path of the high potential side power source VDD1→ the drain terminal of the GaN transistor 13→the source terminal of the GaN transistor 13→the first capacitor 19→the resistor 31→the low potential side output terminal OUTN of the first gate driver 16→the anode terminal of the diode 15→the cathode terminal of the diode 15→the low potential side power source VSS1, a current flowing through the current flow path (i.e., inrush current) can be suppressed.

Consequently, also in the first modified example of the second embodiment, influence on circuit characteristics can be suppressed by suppressing an inrush current.

Second Modified Example of Second Embodiment

In the second embodiment and the first modified example of the second embodiment described above, the resistor 31 remains connected not only when the power source is activated, but also in a normal operating state.

Accordingly, to suppress influence on circuit characteristics, a selection range of the resistor 31 is restricted, and accordingly, a suppression effect of an inrush current is also restricted. In view of the foregoing, in the second modified example, a configuration of providing a switching transistor 32 in parallel with a resistor 31 is employed.

Figure 9:
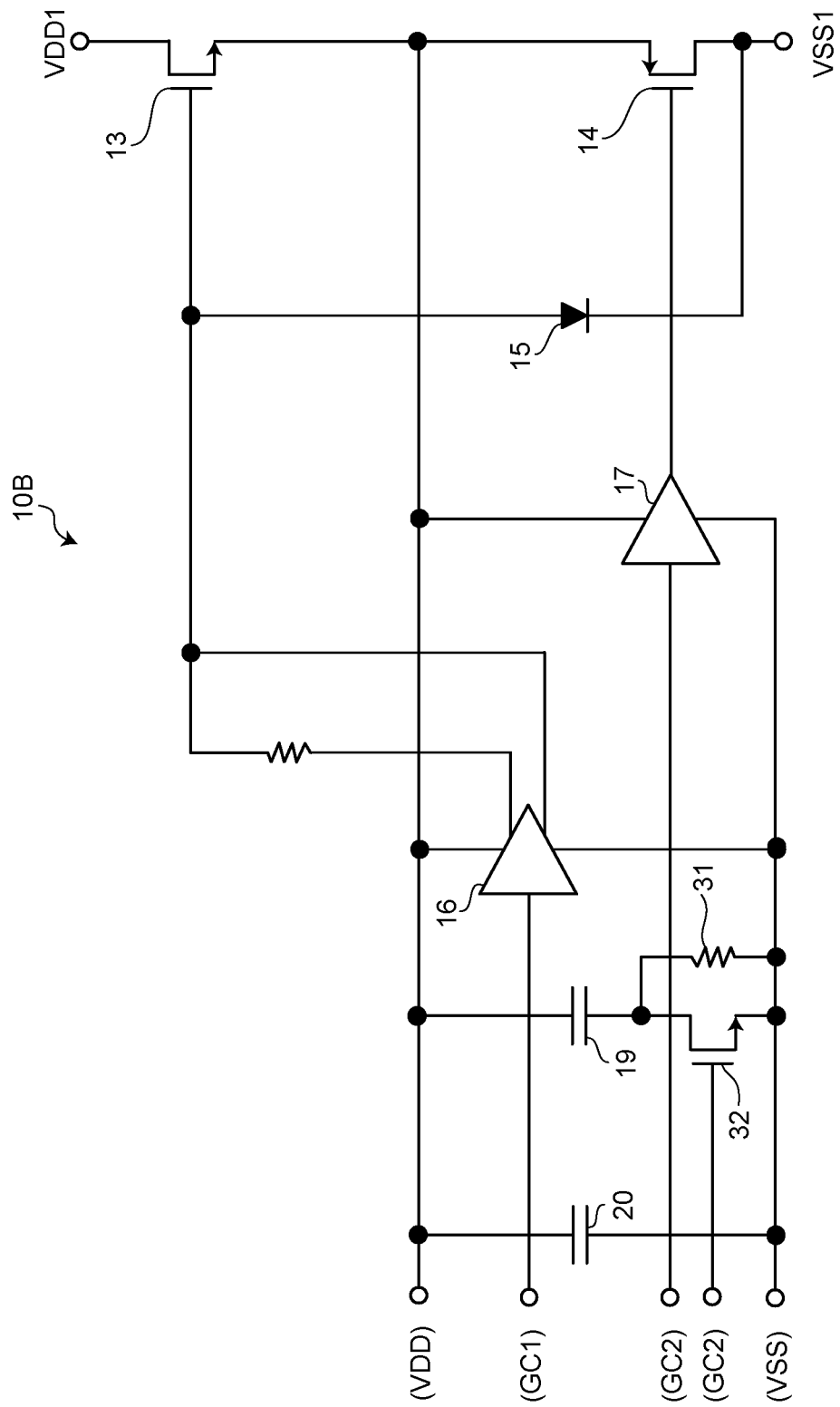
FIG. 9 is an explanatory diagram of a second modified example of the second embodiment.

FIG. 9 is an explanatory diagram of the second modified example of the second embodiment. As illustrated in FIG. 9, a power converter circuit 10B of the second embodiment includes a GaN transistor 13, a P-channel LDMOS transistor 14, a diode 15, a first gate driver 16, a second gate driver 17, a first capacitor 19, a second capacitor 20, the resistor 31, and the switching transistor 32.

Here, as illustrated FIG. 9, the switching transistor 32 is connected in parallel with the resistor 31. In the second modified example of the second embodiment, before the main circuit power source is turned on, the gate terminal of the switching transistor 32 is set to an "L" level and brought into the off state.

Consequently, similarly to the second embodiment, when the main circuit power source is turned on, when a current flows through a path of the high potential side power source VDD1→ the drain terminal of the GaN transistor 13→the source terminal of the GaN transistor 13→the first capacitor 19→the resistor 31→the low potential side output terminal OUTN of the first gate driver 16→the anode terminal of the diode 15→the cathode terminal of the diode 15→the low potential side power source VSS1, a current flowing through the current path (i.e., inrush current) can be suppressed.

On the other hand, a path of the high potential side power source VDD1→ the drain terminal of the GaN transistor 13→the source terminal of the GaN transistor 13→the first capacitor 19→the switching transistor 32→the low potential side output terminal OUTN of the first gate driver 16→the anode terminal of the diode 15→the cathode terminal of the diode 15→the low potential side power source VSS1 is not formed.

Accordingly, at a time point at which a time sufficient for the completion of activation of the insulated power source 12 elapses, via the first gate driver 16 and the second gate driver 17, the gate terminal of the GaN transistor 13 is set to the "L" level, and the gate terminal of the P-channel LDMOS transistor 14 is set to the "L" level. The GaN transistor 13 and the P-channel LDMOS transistor 14 are thereby brought into the on state.

Concurrently with this, the gate terminal of the switching transistor 32 is set to the "H" level. In this case, because an on resistance value of the switching transistor 32 is sufficiently small as compared with a resistance value of the resistor 31, a current effectively flows only in the switching transistor 32.

Accordingly, when the main circuit power source is turned on, similarly to the second embodiment, owing to the resistor 31, it is possible to turn on the main circuit power source without generating an inrush current flowing in the diode 15. Furthermore, if power is supplied to the first gate driver 16 and the second gate driver 17 from the insulated power source, because the switching transistor 32 with an extremely-small resistance value forms a current flow path, circuit characteristics are not affected.

The above description has been given of a case where the resistor 31 is provided between the first capacitor 19 and the low potential side power source VSS of the insulated power source 12. Nevertheless, even in a case where the resistor 31 is provided between the first capacitor 19 and the high potential side power source VDD of the insulated power source 12, or even in a case where the switching transistor 32 is provided in parallel with the resistor 31, a similar effect can be obtained.

The above description of the second embodiment has been given of a case where a resistor serves as a current restriction unit, but an inductor (for example, coil) can also be used in place of the resistor.

The above description has been given of a case where the switching transistor 32 (switching element) and the resistor 31 connected in parallel with the switching transistor 32 (switching element) are included between the first capacitor 19 (first power source smoothing circuit) and the low potential side power source VSS (refer to FIG. 9).

Nevertheless, a configuration in which a switching transistor (switching element: for example, P-channel MOS transistor) provided between the first capacitor 19 (first power source smoothing circuit) and the high potential side power source VDD, and a resistor element connected in parallel with the switching transistor (switching element) are included can also be employed.

Furthermore, a configuration in which a low potential power source side terminal of the first capacitor 19 (first power source smoothing circuit) and a low potential side terminal of the second capacitor 20 (second power source smoothing circuit) are connected in common on the high potential side of the switching element can also be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inrush current suppression circuit comprising:
a normally-on transistor;
a normally-off transistor connected in series with the normally-on transistor;
a first drive circuit configured to drive the normally-on transistor;
a second drive circuit configured to drive the normally-off transistor;
a diode connected between an output of the first drive circuit and an output terminal of the normally-off transistor;
a first power source smoothing circuit configured to perform smoothing of a source current to be supplied to the first drive circuit and the second drive circuit; and a switch circuit configured to switch connection/disconnection of a current path passing through the first power source smoothing circuit.

2. The inrush current suppression circuit according to claim 1, wherein
the switch circuit is connected to either one of a high potential side or a low potential side of the first power source smoothing circuit.

3. The inrush current suppression circuit according to claim 1, wherein
the current path includes the first drive circuit and the diode.

4. An inrush current suppression circuit comprising:
a normally-on transistor;
a normally-off transistor connected in series with the normally-on transistor;
a first drive circuit configured to drive the normally-on transistor;
a second drive circuit configured to drive the normally-off transistor;
a diode connected between an output of the first drive circuit and an output terminal of the normally-off transistor;
a first power source smoothing circuit configured to perform smoothing of a source current to be supplied to the first drive circuit and the second drive circuit; and
a current restriction unit configured to restrict a current amount on a current path passing through the first power source smoothing circuit.

5. The inrush current suppression circuit according to claim 4, further comprising:
a flow path forming unit that is formed in parallel with the current restriction unit, and is configured to be able to switch formation/non-formation of the current path.

6. The inrush current suppression circuit according to claim 4, wherein
the current restriction unit is formed as a resistor or an inductor.

7. The inrush current suppression circuit according to claim 4, wherein
the current path includes the first drive circuit and the diode.

8. The inrush current suppression circuit according to claim 5, further comprising:
a second power source smoothing circuit provided in parallel with the first power source smoothing circuit and having a capacitance smaller than a capacitance of the first power source smoothing circuit.

9. The inrush current suppression circuit according to claim 8, wherein
the flow path forming unit is formed as a switching element.

10. The inrush current suppression circuit according to claim 9, wherein
a low potential power source side terminal of the first power source smoothing circuit and a low potential side terminal of the second power source smoothing circuit are connected in common on a high potential side of the switching element.

11. The inrush current suppression circuit according to claim 4, wherein
the current restriction unit is formed as a resistor or an inductor,
the inrush current suppression circuit further comprises a switching element that is formed in parallel with the current restriction unit, and serves as a flow path forming unit configured to be able to switch formation/non-formation of the current path, and
the switching element is provided between the first power source smoothing circuit and a low potential side power source.

12. The inrush current suppression circuit according to claim 11, further comprising:
a second power source smoothing circuit provided in parallel with the first power source smoothing circuit and having a capacitance smaller than a capacitance of the first power source smoothing circuit, wherein
a low potential power source side terminal of the first power source smoothing circuit and a low potential side terminal of the second power source smoothing circuit are connected in common on a high potential side of the switching element.

13. The inrush current suppression circuit according to claim 4, wherein
the current restriction unit is formed as a resistor or an inductor,
the inrush current suppression circuit further comprises a switching element that is formed in parallel with the current restriction unit, and serves as a flow path forming unit configured to be able to switch formation/non-formation of the current path, and
the switching element is provided between the first power source smoothing circuit and a high potential side power source.

14. The inrush current suppression circuit according to claim 13, further comprising:
a second power source smoothing circuit provided in parallel with the first power source smoothing circuit and having a capacitance smaller than a capacitance of the first power source smoothing circuit, wherein
a high potential power source side terminal of the first power source smoothing circuit and a high potential side terminal of the second power source smoothing circuit are connected in common on a low potential side of the switching element.

* * * * *